United States Patent [19]
Kukimoto et al.

[11] Patent Number: 5,068,204
[45] Date of Patent: Nov. 26, 1991

[54] METHOD OF MANUFACTURING A LIGHT EMITTING ELEMENT

[75] Inventors: Hiroshi Kukimoto, Kanagawa; Iwao Mitsuishi; Takashi Yasuda, both of Tokyo, all of Japan

[73] Assignee: Misawa Co. Ltd., Tokyo, Japan

[21] Appl. No.: 173,067

[22] Filed: Mar. 25, 1988

[30] Foreign Application Priority Data

Mar. 27, 1987 [JP] Japan .................................. 62-71567
Sep. 25, 1987 [JP] Japan ................................ 62-238655
Dec. 29, 1987 [JP] Japan ................................ 62-335866

[51] Int. Cl.$^5$ .............................................. H01L 21/20
[52] U.S. Cl. ......................... 437/127; 148/DIG. 40; 148/DIG. 41; 437/128; 437/905; 437/959
[58] Field of Search .............. 437/81, 3, 105, 108, 437/110, 126, 127, 128, 129, 904, 905, 959, 969; 127/87, 90, 91, 248 B; 148/33, 33.1, 33.4, DIG. 22, 25, 40, 41, 64, 72, 169; 357/16, 17; 156/610-614

[56] References Cited

U.S. PATENT DOCUMENTS

| 4,058,430 | 11/1977 | Suntola et al. | 156/611 |
| 4,066,481 | 1/1978 | Manasevit et al. | 437/3 |
| 4,422,888 | 12/1983 | Stutius | 437/81 |
| 4,487,640 | 12/1984 | Erstfeld | 437/126 |
| 4,623,426 | 11/1986 | Peters | 156/614 |
| 4,632,711 | 12/1986 | Fujita et al. | 156/610 |
| 4,767,494 | 8/1988 | Kobayashi et al. | 437/110 |
| 4,792,832 | 12/1988 | Baba et al. | 437/110 |

FOREIGN PATENT DOCUMENTS

84/03995 10/1984 World Int. Prop. O. .

Primary Examiner—Olik Chaudhuri
Assistant Examiner—William Bunch
Attorney, Agent, or Firm—McAulay Fisher Nissen Goldberg & Kiel

[57] ABSTRACT

A blue light emitting diode which has a multiple layer structure and is grown on a semiconductor crystalline substrate, wherein zinc of a group II element of the periodic table, lithium, sodium, or potassium of group VI elements are used. These elements and their compounds are used as impurities to be introduced into the construction when it is at the condition of vapor growing. A blue light emitting diode has a pair of Ohmic electrodes, an n-type semiconductor layer and a p-type semiconductor layer. These layers are grown from a vapor phase on the substrate and sandwiched between the electrodes.

20 Claims, 2 Drawing Sheets

METHOD OF MANUFACTURING A LIGHT EMITTING ELEMENT

OBJECT OF THE INVENTION

Application fields in industry

This invention is concerned with blue light emitting devices, such as blue light emitting diodes (LEDs) and short wavelength visible lasers, and their manufacturing technologies.

Conventional technologies

Nowadays, mass production techniques for LEDs which emit visible light from red through green have been established and visible light lasers from red through yellow are becoming in practical use. Displays which utilize these devices are also becoming important. Accordingly, increasingly there is a great need and expectation for blue LEDs, which have not been manufactured in a mass-production scale, and blue and green lasers, which have not been fabricated as yet. Blue light is the only color that has not as yet been realized in a family of LEDs; and it is needed in order to produce full color displays.

The first condition required for materials for green and blue LEDs and lasers is that the band gap energy must be larger than 2.6 eV. SiC (2.6 eV), GaN (3.4 eV) and $ZnS_xSe_{1-x}$ (2.7–3.8eV) meet the condition. The other condition to manufacture highly efficient light emitting devices is that a technique should be available to fabricate good p-n junctions with a high quality light emitting layer on large diameter substrates.

However, there exists a great barrier in realizing such light emitting devices. The problems for each material are as follows. SiC which has no appropriate large diameter substrates for epitaxial growth although a pn junction can be fabricated. No p-n junctions with high efficient light emission can be made in GaN because a p-type layer has not been successfully fabricated in spite of a great effort. Furthermore, for $ZnS_xSe_{1-x}$, a p-type crystal can be grown only by means of a solution growth technique, and hence no mass production technique to grow p and n layers on a large diameter substrates with good reproducibility has been developed.

II-VI compound semiconductors such as $ZnS_xSe_{1-x}$ ($0<X<1$) have a wide band gap and are direct transition semiconductors which manifest themselves as highly efficient light emitting materials. In addition, the hetero epitaxy of II-VI materials is possible on Si, Ge and/or GaAs substrates with good lattice-constant matching by selecting the alloy composition x. Such epitaxial growth is achieved either from the Metal Organic Chemical Vapor Deposition (MOCVD) technique or Molecular Beam Epitaxial (MBE) technique. Furthermore, n-type conductivity can be controlled by doping either IIIa elements or VIIa elements in the periodic table. However, a great draw back of these materials is that p-type epitaxial layers can not be grown by conventional techniques. Because of this fact, blue light-emitting-diodes and semiconductor lasers can not be manufactured since for each light emitting device both n and p type layers must be grown successively.

Thus, the present inventors invented a new vapor phase epitaxy technique to grow p-type layers of $ZnS_xSe_{1-x}$ with low resistivity by doping into the p-type layer with Ia elements. These Ia elements which are in the periodic table such as Lithium (Li), Sodium (Na) and Potassium (K) under the condition that a flux ratio of VIa elements to IIb elements ranges from 1 to 100 are useful for this purpose.

In order to solve the aforementioned problems, the present invention claims as a specific invention the multiple layer structures which consist of n-type II-VI semiconductor layers with a resistivity ranging from $10^{-3}$ to $10^3$ Ohm-cm and p-type II-VI semiconductor layers with conductivity ranging from $10^{-3}$ to $10^3$ Ohm-cm, all of which are vapor phase epitaxially grown on semiconductor substrates by selectively changing the composition x with lattice-constant matching. This invention also claims that such manufacturing techniques for the said specific invention that metalorganic gases for II elements and hydride gases for VI elements are used to continuously to grow both n- and p-type II-VI semiconductor layers on lattice matched semiconductor substrates under the condition that the flux ratio of II elements to VI elements is varied from $2\times 10^{-3}$ to 10.

SUMMARY OF THE INVENTION

In summary, as mentioned above, this invention claims [1] that multiple II-VI semiconductor layer structures, which consist of n-type and p-type conductive layers, can be continuously grown by a vapor phase epitaxial technique on semiconductor substrates, [2] that during the epitaxial growth, Ia elements such as Li, Na and K and their compounds are introduced to fabricate p-type $ZnS_xSe_{1-x}$ conductive layers with low resistivity for instance, by choosing Zn as a IIb element and Se and S as VIa elements to form a host crystal, $ZnS_xSe_{1-x}$ on such semiconductor substrates such as Si, GaAs or GaP, [3] that by alternative growth of p-type layers and n-type layers, pn junction blue light emitting devices are fabricated uniformly and with good reproducibility on the said large diameter semiconductor substrates for which mass production techniques have already been established, and [4] thus this invention assures a mass production technique with high yield for blue light emitting devices, with which full color solid state displays using red, green and blue light emitting devices are able to be produced in a large scale.

With this invention, since Va elements which are mentioned in the periodic table, are doped simultaneously with Ia elements, the vacancies of VI host atoms which are produced by the occupation of Ia dopants are compensated for by the doped Va elements, thereby reducing point defects and improving the quality of the crystal.

With this co-doping of Ia and Va elements, Ia elements, which in a normal condition are mobile, can form a bonding with Va elements sitting at the neighboring position in a crystal lattice and hence can be stabilized. Therefore, motion of Ia elements is suppressed, and hence stable characteristics and long life time are expected for light emitting devices manufactured by the present technique.

FIG. 1 illustrates an example of embodiments of this invention achieved by a Metal Organic Vapor Phase Epitaxial apparatus for manufacturing light emitting devices dealt with in this invention. FIG. 2 illustrates the second embodiment of this invention by an MBE apparatus. FIG. 3 illustrates a cross section of an embodiment of the structure of light emitting devices.

EXAMPLE OF EMBODIMENTS

A detailed interpretation of embodiments is given by using the figures in the following.

BRIEF DESCRIPTION OF THE DRAWINGS

Figure 1:
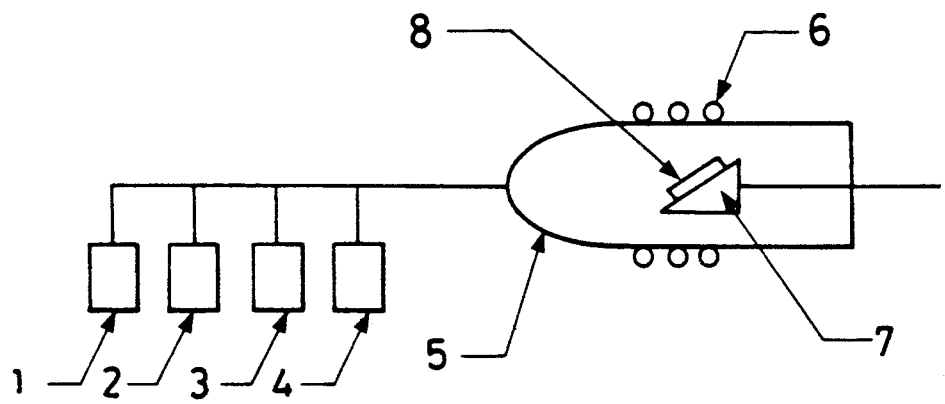
FIG. 1 illustrates the schematic diagram of metalorganic vapor phase epitaxial growth system to be used for fabricating the light-emitting devices with which this invention is concerned, where host and impurity source materials are transported from their containers (1–4) to a reactor chamber (5) and crystal growth takes place on a substrate (8) mounted on a susceptor (7) heated with an rf coil (6).

FIG. 1 illustrates an example of embodiments, an MOVPE apparatus for manufacturing light emitting devices such as blue LEDs and visible light (blue and green) lasers. 1 is a cylinder of IIb elements, for instance, Zn which is a source of a host atom in a II-VI semiconductor, 2 and 3 are cylinders of VIa elements such as Se and S which are sources of V elements in a host crystal. 4 is a cylinder for impurities such as Li, Na or K or their compounds. All the host atoms and impurities are selectively supplied from these cylinders to a reactor tube 5 which is made from silica. An induction heater 6 heats a graphite susceptor 7 inserted in the reactor 5 and the temperature of a semiconductor substrate 8, for instance, a GaAs wafer, which is set on the susceptor 7 is raised. The multiple layer structure which consists of, for instance, a p-type II-VI semiconductor layer 9 on an n-type II-VI semiconductor layer 10 grown on an n-type III-V semiconductor substrate 8 as shown in FIG. 3 can now be formed by a continuous vapor phase epitaxial growth. 11 and 12 in the figure are Ohmic contact electrodes.

Figure 2:
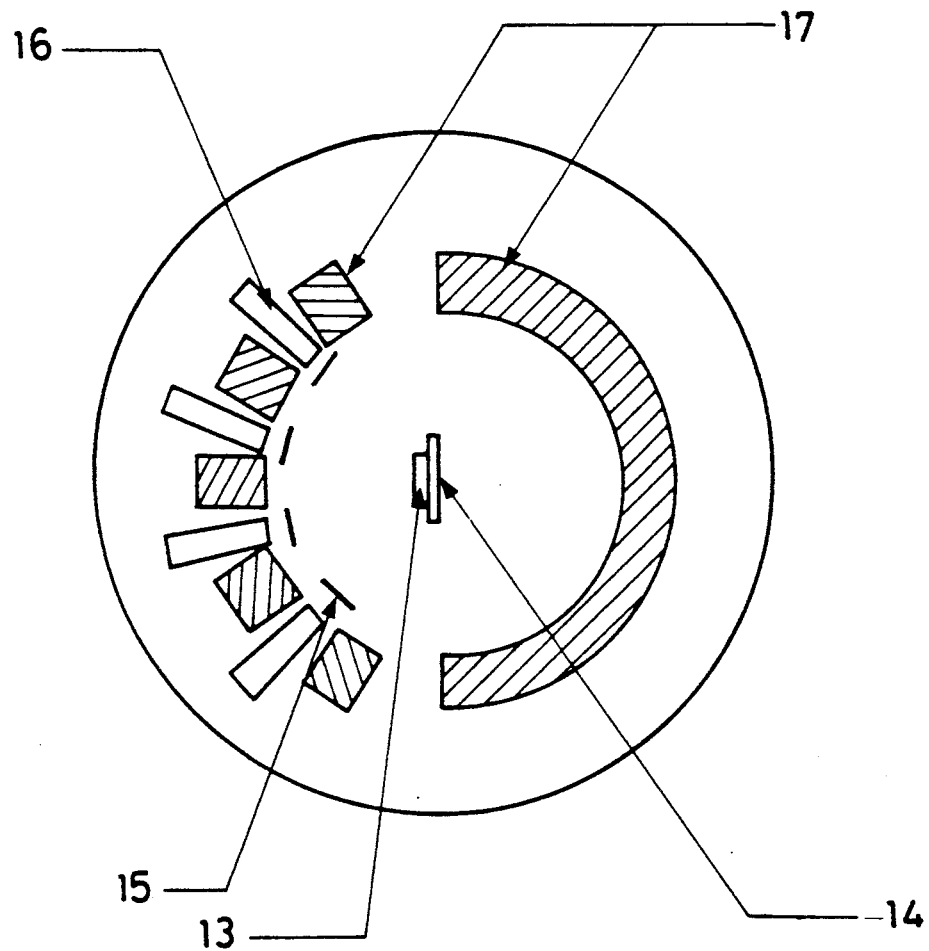
FIG. 2 illustrates the configuration of the source materials and the substance on which an epitaxial layer is to be grown by molecular beam epitaxy.

FIG. 2 illustrates another example of the embodiments, an MBE apparatus which is used to manufacture the structure claimed in the present invention. In the figure, 16 is a crucible heated by a resistive heater, 17 is a liquid nitrogen cooled shroud, and 15 is a shutter. A molybdenum beam susceptor 14 is placed in the center of the liquid nitrogen cooled shroud 17 and a semiconductor substrate 13 is set on the susceptor 14. The grown II-VI semiconductor crystal layer is formed by continuous epitaxial growth on a semiconductor substrate 13 through a shutter 15. The structure shown in FIG. 3 is formed by continuous epitaxial growth of an n-type II-VI semiconductor layer such as an n-type ZnSe 10 layer and a p-type II-VI semiconductor layer such as a p-type ZnSe 9 on a GaAs substrate 8.

In the figure, 8 is a GaAs substrate and an n-type semiconductor single crystal layer such as $ZnS_xSe_{1-x}$ (x=0.08) 10 or ZnSe is grown on the said substrate 8. 9 is a p-type $ZnS_xSe_{1-x}$ or ZnSe. To form the said p-type $ZnS_xSe_{1-x}$, Ia elements such as Li and Va elements such as N are simultaneously doped. A pn junction is formed between the said p-type layer 9 and the n-type layer 10. 12 is an Ohmic contact for the n-type material and 11 is an Ohmic contact for the p-type material.

Figure 3:
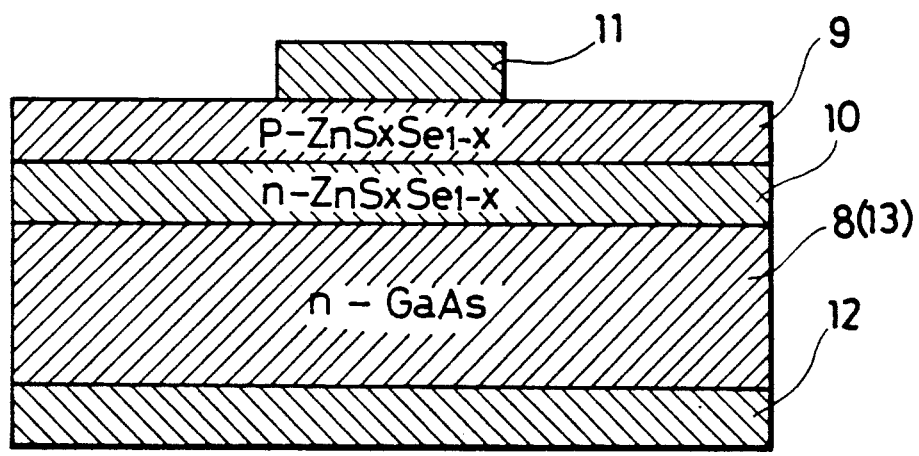
FIG. 3 illustrates a cross-section of one of the light-emitting diodes with which this invention is concerned. This diode consists of a p-type $ZnS_xSe_{1-x}$ layer (9), an n-type $ZnS_xSe_{1-x}$ layer (10) and an n-type GaAs substrate 8. Ohmic electrodes (11,12) made on both sides of the surfaces.

In an LED structure shown in the FIG. 3, since Va elements such as N are doped as well as Ia elements, lattice defects can be reduced as compared with the case where only Ia element is doped as an acceptor to realize a p-type conductivity. So far it is said that Se vacancies are produced by Ia elements such as Li which forms bonding with the II elements such as Zn in a lattice.

Contrary to the above fact, the co-doping of Va elements such as N with Ia elements during vapor phase epitaxy suppresses the generation of point defects, since Se-vacancies are replaced with doped Va elements such as N. Thus, a p-type crystal film can be vapor phase epitaxialy grown with very low concentration of point defects even under a high impurity concentration.

With this co-doping of Li and N, Li which is mobile in a normal condition, can form a bonding with N at the neighboring position in a crystal lattice and hence becomes immobile. Therefore, motion of Li is suppressed, and stable characteristics and long life time of light emitting devices are expected. The n-type epitaxial layer 10 and the p-type epitaxial layer 9 can be formed by continuous epitaxial growth using either the MOVPE apparatus or the MBE apparatus.

This invention is not limited to the aforementioned cases but is also extended to other cases; for instance, in the p-type $ZnS_xSe_{1-x}$ layer 9, Na and K can be used in place of Li as an acceptor and Phosphorous (P) and Arsenic (As) can be used in place of N.

In addition, in FIG. 3 the substrate 8 is n-type GaAs but p-type GaAs can be used, too. In this case, a p-type layer is first grown on the p-type substrate and then an n-type layer is grown on the top to form a blue light emitting devices, which has a similar characteristics as that shown in the figure.

In the examples of embodiments described here, the alloy composition x in the $ZnS_xSe_{1-x}$ is chosen to be 0.08 in order to match the lattice constants and then the emitted light is blue and the quantum efficiency is increased by a factor of 2. However, the composition x can be varied according to the desired color, i.e., the light wavelength, and the most appropriate substrate can be chosen so that the lattice constants match to each other. In that case x should be $0 < x < 1$.

EXAMPLE 1

Diethylzinc (DEZn) diethylselenide (DESe) and lithium nitride ($Li_3N$) were used as source materials for growing a p-type ZnSe layer. These materials in vapor phase were transported to a reactor chamber (5) as shown in FIG. 1 with hydrogen carrier gas. At the transport rates of $1 \times 10^{-5}$ mole/min for DEZn, $2 \times 10^{-4}$ mole/min for DESe and $3 \times 10^{-9}$ mole/min for ($Li_3N$), a 1 μm-thick p-type ZnSe layer with a carrier concentration of $8.8 \times 10^{17}$ cm$^{-3}$ and a resistivity of 0.19 Ω cm was grown epitaxially on a GaAs substrate (8) mounted on a graphite susceptor (7) heated at 450° C.

EXAMPLE 2

Diethylzinc (DEZn), diethylselenide (DESe), diethylsulphide (DES) and lithium nitride ($Li_3N$) were used as source materials for growing a p-type $ZnS_xSe_{1-x}$ (x≈0.08) layer. The growth was carried out in the same system as used in Example 1. At the transport rates of $1 \times 10^{-5}$ mole/min for DEZn, $2 \times 10^{-4}$ mole/min for DESe, $5\times10^{-3}$ mole/min, a 1 μm-thick p-type $ZnS_xSe_{1-x}(x\approx 0.08)$ layer with a carrier concentration of $5.9\times10^{16}$ cm and a resistivity of 0.5 Ω cm was grown epitaxially on a GaAs substrate at 450° C.

EXAMPLE 3

A p-type $ZnS_xSe_{1-x}(x\approx 0.08)$ with a carrier concentration of $4.5\times10^{16}$ cm$^{-3}$ and a resistivity of 0.8 Ω cm was grown on a GaAs substrate at 300° C. by molecular beam epitaxy. Configuration of source materials, Zn, S, Se and Li$_3$N in the growth chamber is schematically shown in FIG. 2. Source temperature of Zn, S, Se and Li$_3$N were kept at 300° C., 310° C., 200° C. and 470° C., respectively, during growth.

EXAMPLE 4

A blue light-emitting diode with an emission peak at 467 nm and an external quantum efficiency of 0.8% was fabricated by metalorganic chemical vapor deposition. The diode consisted of an n-type ZnSe layer with carrier concentration of $5\times10^{17}$ cm$^{-3}$ and a p-type ZnSe layer with carrier concentration of $1\times10^{17}$ cm$^{-3}$. The n- and p-type layers were sequentially grown on a p-type GaAs substrate. Dimethylzinc (DMZn) and diethylselenide (DESe) were used as source materials. Trimethylaluminum (TEA1), and Li$_3$N were used as n- and p-type dopant sources, respectively.

Typical transport rates of DMZn, DESe, TEA1 and Li$_3$N were $1\times10^{-5}$ mole/min, $2\times10^{-4}$ mole/min, $1\times10^{-8}$ mole/min and $3\times10^{-8}$ mole/min, respectively. The growth temperature was 450° C.

EXAMPLE 5

A ZnSe blue light-emitting diode of the same structure as described in Example 4 was also fabricated by molecular beam epitaxy at 300° C. with the use of source materials of Zn, Se, Al (n-type dopant) and Li$_3$N (p-type dopant). The external quantum efficiency was 0.2%. The peak wavelength of emission band was located at 467 nm.

We claim:

1. A method of manufacturing a light emitting element, comprising the steps of:
   vapor phase growing of a II-VI compound with semiconductor crystal layers having (p) type conduction of low resistivity on a semiconductor substrate;
   introducing impurities of group Ia elements and their compounds, during the growth step, under the condition that the flux ratio of a group VIa element to a group IIb element ranges from 1 to 100 for constructing a basic body of said II-VI compound semiconductor crystal layers; and
   the introduction of the impurities of the group Ia elements includes a simultaneous doping of the Va elements with said group Ia elements so that the mobility thereof is suppressed, and vacancies of the VI host atoms produced by the group Ia elements acting as dopants are compensated by the doped Va elements, whereby to reduce point defects and improve the quality of the crystal layers for forming a crystal suitable for a light emitting diode.

2. The method as claimed in claim 1, wherein the group IIb elements consisting of zinc (Zn) and group VI elements consisting of selenium (Se) and sulfur (s) are used for constructing the body, and the group Ia elements consisting of lithium (Li), sodium (Na), or potassium (K) and their compounds are introduced as impurities.

3. The method as claimed in claim 1, including the step of introducing the Ia impurities of the Ia elements and their compounds for fabricating p-type $ZnS_xSe_{1-x}$ conductive layers.

4. The method as claimed in claim 1, including alternatively growing a p-type layer on an n-type substrate $ZnS_xSe_{1-x}$ and an n-type layer on a p-type substrate $ZnS_xSe_{1-x}$, respectively, and wherein x is greater than zero and less than 1 ($0<x<1$).

5. The method as claimed in claim 1, wherein the Va elements are selected from the group consisting of nitrogen (N), phosphorous (P and arsenic (As) and the co-doping of the Ia and the Va elements form a bonding with the Ia elements to thereby suppress motion of the Ia elements and provide stable characteristics.

6. The method as claimed in claim 1, including continuously growing an n-type II-VI semiconductor layer ZnSe and a p-type semiconductor layer ZnSe on a GaAs, a Si or a GaP substrate in a molecular beam epitaxial apparatus.

7. The method as claimed in claim 1, including forming a multi-layer structure consisting of a p-type II-VI semiconductor layer on an n-type II-VI semiconductor layer grown on an n-type III-V semiconductor substrate which is formed by a continuous vapor phase epitaxial growth.

8. The method as claimed in claim 3, wherein X is greater than zero and less than 1 ($0<x<1$).

9. A method of manufacturing a light emitting element, comprising the steps of:
   vapor phase growing of a II-VI compound with semiconductor crystal layers having (p) type conduction of low resistivity on a semiconductor substrate;
   introducing impurities of group Ia elements and their compounds, during the growth step, under the condition that the flux ratio of a group VIa element to a group IIb element ranges from 1 to 100 for constructing a basic body of said II-VI compound semiconductor crystal layers;
   the II-VI compound semiconductor layer contains acceptors of a group Ia element and a group Va element; and
   co-doping of an element of Group IA with an element of Group Va.

10. The method as claimed in claim 9, wherein the group IIb elements consisting of zinc (Zn) and group VI elements consisting of selenium (Se) and sulfur (S) are used for constructing the body, and the group Ia elements consisting of lithium (Li), sodium (Na), or potassium (K) and their compounds are introduced as impurities.

11. A method of manufacturing a blue light emitting diode, comprising the steps of:
   continuously growing a II-VI compound semiconductor layers of (n) conduction and a II-VI compound semiconductor layers of (p) type conduction of low resistivity from a vapor phase on a semiconductor substrate crystal having the same lattice constant;
   controlling the flow ratio of the group VI elements to the group II elements within a range from 1 to 100 by using the gas phase reactants of an organometallic component for the group II elements and a hydride or alkyl compound for the group VI elements;

vapor phase epitaxially growing p-type layers of $ZnS_xSe_{1-x}$ multiple layer structures consisting of n-type II–VI semiconductor layers having a resistivity ranging from $10^{-3}$ to $10^3$ ohm-cm by selectively changing the composition x with lattice-constant matching;

doping the p-type layers of $ZnS_xSe_{1-x}$ with Ia elements including lithium (Li), sodium (Na) and potassium (K); and simultaneously doping the Va elements with the Ia elements.

12. The method as claimed in claim 11, wherein X is greater than zero and less than 1 ($0<x<1$).

13. The method as claimed in claim 11, wherein x in the alloy composition in 0.08 to match the lattice constants with GaAs and GaP substrates, respectively, whereby to provide blue emitted light.

14. The method as claimed in claim 12, wherein the group VI elements are selected from group VIa and the group II elements are selected from group IIb.

15. The method as claimed in claim 11, comprising introducing impurities of group Ia elements and their compounds during the vapor phase growth.

16. The method as claimed in claim 11, wherein the group VIa elements include sulphur (S) and selenium (Se) and the group IIb elements include zinc (Zn).

17. A method of manufacturing a light emitting element, comprising the steps of:

vapor phase growing of a II–VI compound with semiconductor crystal layers having (p) type conduction of low resistivity on a semiconductor substrate;

introducing impurities of group Ia elements and their compounds, during the growth step, under the condition that the flux ratio of group VIa element to group IIb element ranges from 1 to 100 for constructing a basic body of said II–VI compound semiconductor crystal layers; and co-doping of the Group IA elements with Group VA elements.

18. The method as claimed in claim 17, including selecting Va elements from the group consisting of nitrogen (N), phosphorous (P) and arsenic (As) and co-doping of the Ia and the Va elements to form a bonding with the Ia elements to thereby suppress motion of the Ia elements and provide stable characteristics.

19. The method as claimed in claim 18, including forming a host crystal on a semiconductor substrate on which an epitaxial layer is grown and selected from the group consisting of Si, GaAs and GaP.

20. The method as claimed in claim 18, including alternatively growing a p-type layer on a n-type substrate and on a n-type layer on a p-type and n-type substrates $ZnS_xSe_{1-x}$, respectively.

* * * * *

UNITED STATES PATENT AND TRADEMARK OFFICE
CERTIFICATE OF CORRECTION

PATENT NO. : 5,068,204
DATED : November 26, 1991
INVENTOR(S) : Hiroshi KUKIMOTO et al.

It is certified that error appears in the above-identified patent and that said Letters Patent is hereby corrected as shown below:

Column 1, line 49, change "Ge" to --GaP--.

Column 3, line 18, change "8." to --(8).--.

Column 4, line 49, after "(DEZn)" insert a comma.

Signed and Sealed this

Eighteenth Day of May, 1993

Attest:

MICHAEL K. KIRK

*Attesting Officer*   Acting Commissioner of Patents and Trademarks